(12) United States Patent
Covington

(10) Patent No.: US 6,865,109 B2
(45) Date of Patent: Mar. 8, 2005

(54) MAGNETIC RANDOM ACCESS MEMORY HAVING FLUX CLOSURE FOR THE FREE LAYER AND SPIN TRANSFER WRITE MECHANISM

(75) Inventor: Mark William Covington, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/456,673

(22) Filed: Jun. 6, 2003

(65) Prior Publication Data

US 2004/0246776 A1 Dec. 9, 2004

(51) Int. Cl.[7] .............................................. G11C 11/15
(52) U.S. Cl. ........................ 365/173; 365/171; 365/158
(58) Field of Search ................................ 365/173, 171, 365/55, 100, 158, 117, 97, 232

(56) References Cited

U.S. PATENT DOCUMENTS

| | | |
|---|---|---|
| 5,640,343 A | 6/1997 | Gallagher et al. |
| 5,695,864 A | 12/1997 | Slonczewski |
| 5,715,121 A | 2/1998 | Sakakima et al. |
| 5,768,181 A | 6/1998 | Zhu et al. |
| 5,841,692 A | 11/1998 | Gallagher et al. |
| 6,130,814 A | 10/2000 | Sun |
| 6,166,948 A | 12/2000 | Parkin et al. |
| 6,201,673 B1 | 3/2001 | Rottmayer et al. |
| 6,256,223 B1 | 7/2001 | Sun |
| 6,436,526 B1 | 8/2002 | Odagawa et al. |
| 6,469,926 B1 | 10/2002 | Chen |
| 6,512,690 B1 | 1/2003 | Qi et al. |
| 6,611,405 B1 * | 8/2003 | Inomata et al. ........... 360/324.2 |
| 6,714,444 B2 * | 3/2004 | Huai et al. ................... 365/171 |
| 2001/0022373 A1 | 9/2001 | Minakata et al. |
| 2002/0105823 A1 | 8/2002 | Redon et al. |
| 2002/0105827 A1 * | 8/2002 | Redon et al. ................ 365/173 |
| 2003/0007398 A1 | 1/2003 | Daughton et al. |
| 2003/0011944 A1 * | 1/2003 | Hosomi .................... 360/324.1 |
| 2003/0048658 A1 * | 3/2003 | Chen ........................... 365/158 |
| 2003/0048676 A1 | 3/2003 | Daughton et al. |
| 2003/0053266 A1 * | 3/2003 | Dieny et al. ................. 360/324 |
| 2003/0133232 A1 * | 7/2003 | Li et al. ................... 360/324.1 |
| 2004/0170055 A1 * | 9/2004 | Albert et al. ................ 365/173 |

OTHER PUBLICATIONS

J. C. Slonczewski, "Current–Driven Excitation of Magnetic Multilayers," *Journal of Magnetism and Magnetic Materials*, vol. 159, 1996, pp. LI–L7.

J. A. Katine et al., "Current–Driven Magnetization Reversal and Spin–Wave Excitations in Co/Cu/Co Pillars," *Physical Review Letters*, vol. 84, No. 14, Apr. 3, 2000, pp. 3149–3152.

* cited by examiner

Primary Examiner—Anh Phung
Assistant Examiner—Dang T Nguyen
(74) Attorney, Agent, or Firm—Robert P. Lenart; Pietragallo, Bosick & Gordon

(57) ABSTRACT

A magnetic random access memory comprises a plurality of memory elements each comprising a magnetic pinned layer; a synthetic antiferromagnetic free layer including a first ferromagnetic layer, a second ferromagnetic layer, and a first nonmagnetic layer positioned between the first ferromagnetic layer and the second ferromagnetic layer, wherein the directions of magnetization of the first ferromagnetic layer and the second ferromagnetic layer are antiparallel; and a first conductive nonmagnetic layer positioned between the magnetic pinned layer and the synthetic antiferromagnetic free layer; and means for applying a current to each of the plurality of memory elements to affect the direction of magnetization of the synthetic antiferromagnetic free layer. A method of storing data using the magnetoresistive random access memory is also provided.

22 Claims, 7 Drawing Sheets

MAGNETIC RANDOM ACCESS MEMORY HAVING FLUX CLOSURE FOR THE FREE LAYER AND SPIN TRANSFER WRITE MECHANISM

FIELD OF THE INVENTION

This invention relates to magnetic random access memories, and more particularly to magnetic random access memories that utilize a spin transfer write mechanism.

BACKGROUND OF THE INVENTION

Magnetic random access memory, or MRAM, is a burgeoning new technology that will provide non-volatile data storage in a compact, low-power device. MRAM comprises an array of cells where each cell stores one bit in at least one magnetoresistive (MR) element. Bits are defined by the magnetic configuration of a free ferromagnetic layer (FL) within an MR element. The magnetic orientation of the FL with respect to a pinned ferromagnetic layer (PL) is measured via a magnetoresistive effect during read-back.

MRAM technology is still in its infancy and has yet to reach the commercial market. Among the many challenges facing MRAM is the stabilization of a uniformly magnetized FL. Since common MRAM designs use magnetic fields generated by current carrying wires to write bits, the FL necessarily must have a net magnetic moment so that the magnetic write field can align the FL into its intended direction. However, the stabilization of a finite moment FL into a single domain state presents a challenge because of the need to combat energetically prohibitive free magnetic charges at the surface of the FL. There is a strong preference for the FL magnetization to achieve flux closure internally in the form of a vortex rather than having field lines close through free space. Even when a stable single domain state is achieved, the magnetostatic fields generated by the FL will interact with neighboring magnetoresistive elements, thereby limiting the packing density of cells. Flux closure is therefore a significant issue affecting the reproducibility of single domain bits, but a finite moment FL is an unavoidable obstacle for those MRAM designs that write bits with magnetic fields. Proposals to try to minimize this problem have called for the fabrication of a FL from a synthetic antiferromagnet (SAF), where two ferromagnetic layers are strongly coupled antiferromagnetically through a nonmagnetic spacer layer. But, these proposals still require a net moment for the FL and are only a stopgap solution to the problem.

An alternative write mechanism is spin momentum transfer. This effect exploits the torque exerted by a spin polarized current of conduction electrons on the localized moments in a ferromagnet. No magnetic fields are required to write bits. The only requirements are that the magnetoresistive elements each contain a PL and FL and that electrical current can be passed through each device in a direction perpendicular to the planes (CPP) of the thin film multilayer memory element, which is also called a pillar. The FL can then be oriented into either parallel or antiparallel configurations with respect to the PL simply by applying a CPP current of sufficient magnitude and proper direction through the device. Spin transfer torque is significantly large for CPP pillars having cross-sectional areas on the order to $10^4$ $nm^2$ or less, and becomes more efficient with respect to write current with decreasing pillar size. Hence, there are proposals to use this effect in ultra-high density MRAM.

The concept of using a SAF structure to provide flux closure has been described in existing patents and has been proposed for use as a read sensor or in an MRAM cell. However, these proposals provide only a partial solution because the proposed SAF structures require a net moment in order to work properly in the magnetic fields of the intended application.

It would be desirable to provide an MRAM structure that uses a spin transfer write mechanism and includes flux closure for the free layer.

SUMMARY OF THE INVENTION

A magnetic random access memory comprises a plurality of memory elements each comprising a magnetic pinned layer; a synthetic antiferromagnetic free layer including a first ferromagnetic layer, a second ferromagnetic layer, and a first nonmagnetic layer positioned between the first ferromagnetic layer and the second ferromagnetic layer, wherein the directions of magnetization of the first ferromagnetic layer and the second ferromagnetic layer are antiparallel; and a first conductive nonmagnetic layer positioned between the magnetic pinned layer and the synthetic antiferromagnetic free layer; and means for applying a current to each of the plurality of memory elements to affect the direction of magnetization of the synthetic antiferromagnetic free layer.

The magnetic moment of the first ferromagnetic layer and the magnetic moment of the second ferromagnetic layer are balanced. The magnetic random access memory can further comprise an antiferromagnetic layer positioned adjacent to the magnetic pinned layer.

A nano-oxide layer can be positioned either within the first ferromagnetic layer, or within the pinned layer, or within both the first ferromagnetic layer and the pinned layer.

The magnetic random access memory can further comprise a second pinned layer; a second nonmagnetic layer positioned between the second pinned layer and the synthetic antiferromagnetic free layer; and wherein the first nonmagnetic layer comprises an insulating tunnel barrier layer.

The magnetic random access memory can further comprise means for applying a magnetic field in a direction substantially perpendicular to the directions of magnetization of the synthetic antiferromagnetic free layer.

In another aspect the invention provides a method of storing information in a magnetic random access memory comprising: providing a plurality of memory elements each comprising a magnetic pinned layer, a synthetic antiferromagnetic free layer, and a first nonmagnetic layer positioned between the magnetic pinned layer and the synthetic antiferromagnetic free layer, wherein the synthetic antiferromagnetic free layer includes a first ferromagnetic layer, a second ferromagnetic layer, and a first nonmagnetic layer positioned between the first ferromagnetic layer and the second ferromagnetic layer, wherein the directions of magnetization of the first ferromagnetic layer and the second ferromagnetic layer are antiparallel; and applying a current to the plurality of memory elements to affect the direction of magnetization of the synthetic antiferromagnetic free layer.

The invention also encompasses a magnetic random access memory comprising: a plurality of memory elements each comprising a magnetic pinned layer, a free layer, and a first nonmagnetic layer positioned between the magnetic pinned layer and the free layer; means for applying a current to each of the plurality of memory elements to affect the direction of magnetization of the synthetic antiferromagnetic free layer; and a magnetic structure positioned adjacent to opposite ends of the free layers for providing a flux closure path.

The magnetic structure can comprise a magnetic keeper positioned adjacent to a side of each of the plurality of memory elements, or a magnetic keeper positioned adjacent to the free layer of each of the plurality of memory elements.

DETAILED DESCRIPTION OF THE INVENTION

Figure 1:
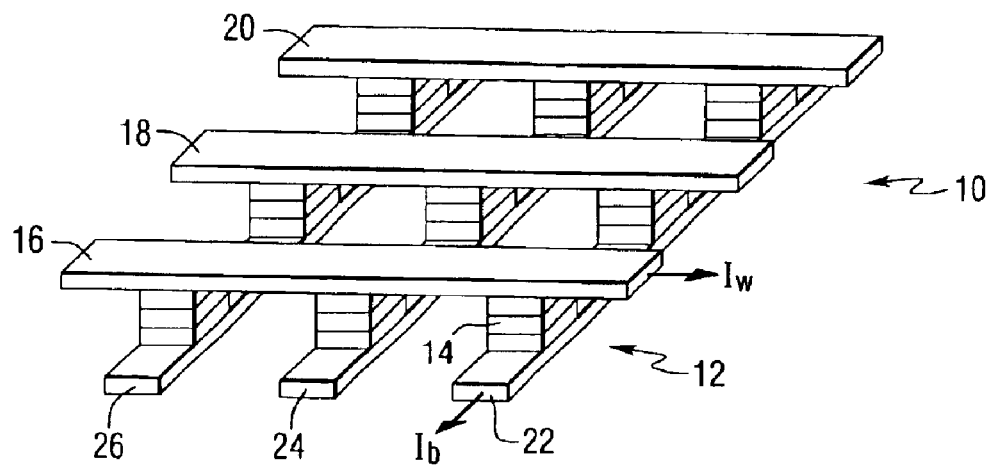
FIG. 1 is a schematic representation of a prior art MRAM.

Referring to the drawings, FIG. 1 is a schematic representation of a conventional magnetic random access memory 10. MRAM 10 includes a 3×3 array of cells 12 that are a subset of the total number of cells comprising the MRAM device. Every cell contains one MR element 14. There are two roughly orthogonal sets of electrical wires, referred to as word lines 16, 18 and 20, and bit lines 22, 24 and 26, that overlap the MR elements. A bit is written only at the intersection of the word and bit lines that have current flowing through them.

Figure 2:
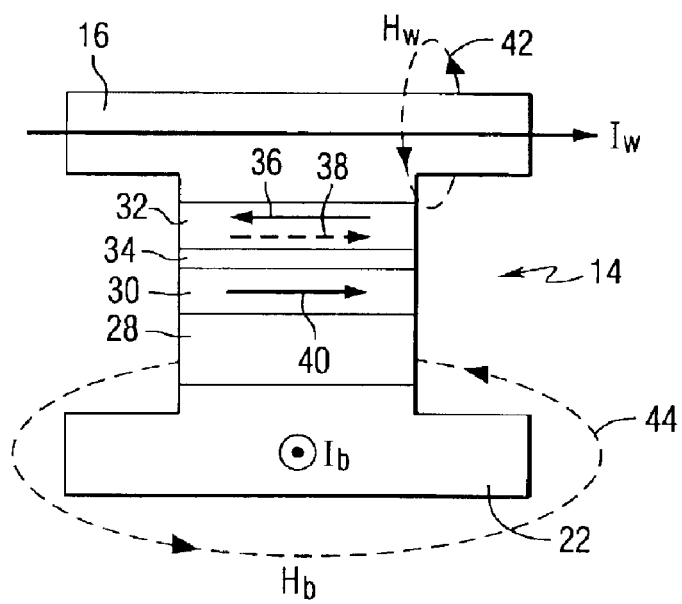
FIG. 2 is a cross-sectional view of a prior art MR element.

FIG. 2 is a cross-sectional view of a MR element 14, which for this particular example is a magnetic tunnel junction. The MR element is connected between a word line 16 and a bit line 22, and includes an antiferromagnetic layer 28, a pinned layer 30 positioned on the antiferromagnetic layer, a free layer 32, and a nonmagnetic layer 34 between the pinned layer and the free layer. The arrows 36 and 38 in the free layer, and arrow 40 in the pinned layer indicate the direction of magnetization. Current passing through the word line produces a field 42 along the hard axis of the free layer. Current passing through the bit line produces a field 44 along the easy axis of the free layer. Extra components in the cell, such as diodes or transistors, are omitted for clarity.

Figure 3:
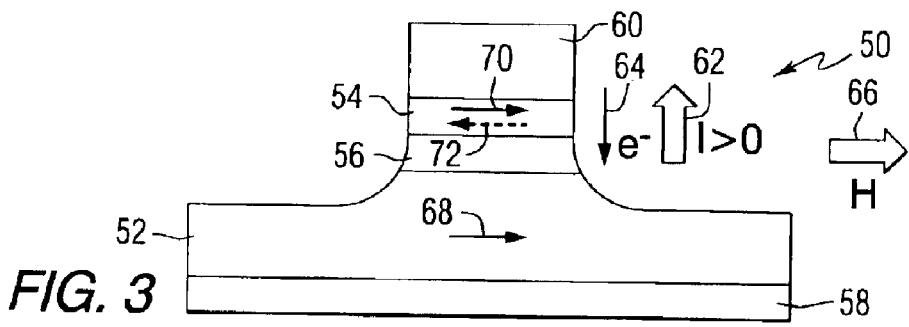
FIG. 3 is a cross-sectional view of a MR element used to demonstrate the principle of this invention.

FIG. 3 is a cross-sectional view of a magnetoresistive element 50 in the form of a CPP pillar. Magnetoresistive element 50 includes two layers of ferromagnetic material 52 and 54, which can be CoFe, positioned on opposite sides of a layer of nonmagnetic material 56, which can be Cu. The magnetoresistive element 50 is positioned between a bottom contact 58 and a top contact 60. The contacts provide an electrical current to the MR element. The direction of conventional current is illustrated by arrow 62 and the direction of electron current is illustrated by arrow 64. In one example, the device includes a CoFe150/Cu30/CoFe50 CPP trilayer structure, where the layers are listed from bottom to top and the numbers refer to the layer thicknesses in Å. The pillar can be ~100 nm in diameter in the narrow region containing the upper CoFe and Cu layers. The bottom CoFe layer in this example is a 6 μm×6 μm square that has been only partially etched during the definition of the CPP pillar. A transverse magnetic field H, as illustrated by arrow 66 is applied to the structure by a magnetic field producing means such as an electromagnet, not shown in this view.

The structure shown in FIG. 3 was employed in the first experimental demonstration of spin momentum transfer and has since been copied by others. In this example, the bottom CoFe layer is a relatively large 6 μm×6 μm square that has only been partially etched while the top CoFe layer is part of a narrow pillar that is approximately 100 nm in diameter. The motivation for using this structure is two-fold in that it is simple, and where the bottom CoFe layer has a considerably larger volume than the top CoFe layer. In an applied magnetic field, the bottom layer will have a much larger Zeeman energy than the top layer. This property, and exchange coupling, will therefore keep the magnetization 68 of the bottom layer fixed, and any switching by spin transfer will occur in the top layer only as illustrated by arrows 70 and 72, which represent the magnetization of layer 54.

Figure 4:
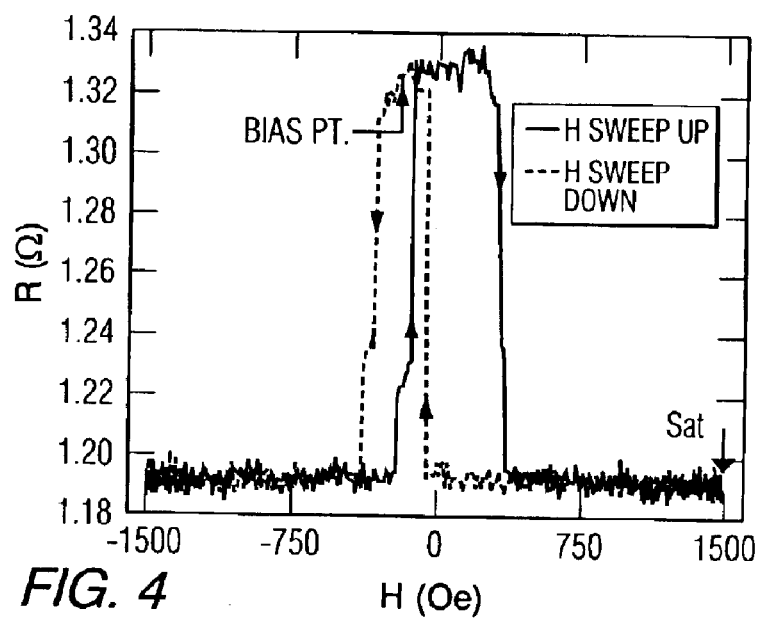
FIG. 4 is a graph of resistance versus magnetic field for the MR element of FIG. 3.
Figure 5:
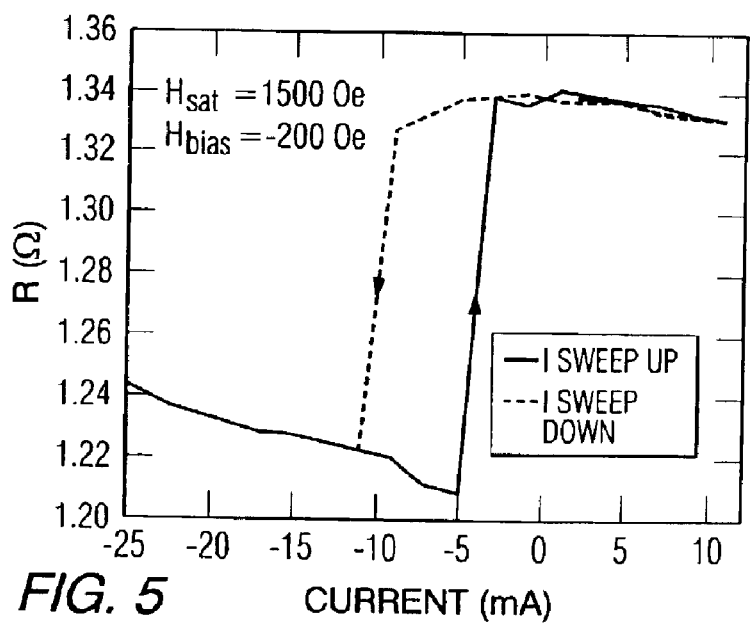
FIG. 5 is a graph of resistance versus current for the MR element of FIG. 3.

FIGS. 4 and 5 show experimental data that demonstrate the effect of spin momentum transfer. FIG. 4 shows the resistance of the MR element as a function of external magnetic field using a bias current of +0.5 mA. FIG. 5 shows the resistance of the MR element as a function of current perpendicular to the plane (CPP). The data were acquired after first saturating and then biasing the device with magnetic fields.

The resistance versus magnetic field characteristics for this device, shown in FIGS. 4 and 5, illustrate that the two magnetic layers exhibit different field switching thresholds, producing regions where the magnetizations of the two layers are either parallel or anti-parallel. FIG. 5 shows how spin momentum transfer can alter the magnetic configuration. The magnetic field history produces an antiparallel alignment of the two layer magnetizations that is stable in the absence of an electrical current. However, by applying a CPP current, the device can reproducibly switch between the same low and high resistance states observed in the resistance versus field data. The asymmetry of the data about zero current is a hallmark of spin transfer and is consistent with published experimental data. For such a combination of fixed and free magnetic layers typified by this device, the FL favors parallel alignment with respect to the fixed layer when electrons flow from the bottom to top. Similarly, the FL favors antiparallel alignment with respect to the fixed layer when electrons flow from the top to bottom.

Figure 6:
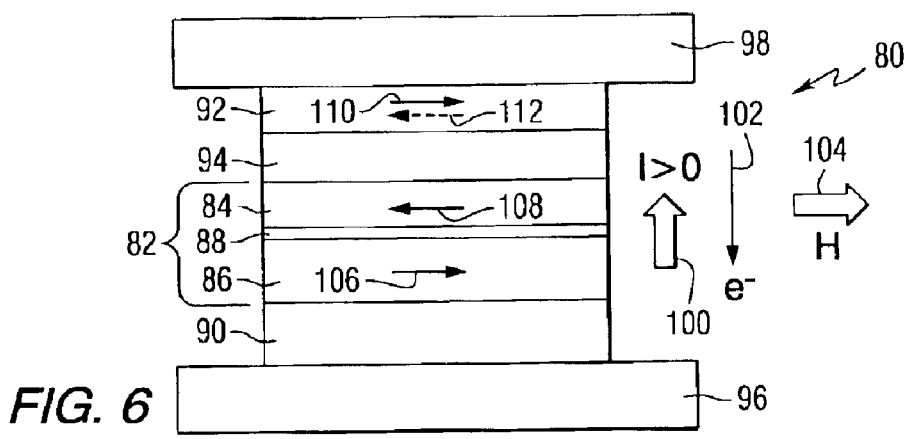
FIG. 6 is a cross-sectional view of a MR element constructed in accordance with this invention.

The device in FIG. 3 is useful for scientific studies of spin transfer, but it is impractical for MRAM since it needs to be stabilized by an external magnetic field. FIG. 6 is a cross-sectional view of a magnetoresistive element 80 in the form of a CPP pillar, that is more suited for practical devices. Magnetoresistive element 80 includes a trilayer structure 82 having two layers of ferromagnetic material 84 and 86 that are antiferromagnetically coupled via RKKY coupling mediated by layer 88. These layers comprise a synthetic antiferromagnet (SAF) that is pinned via exchange coupling to an antiferromagnetic layer 90. A free layer of ferromagnetic material 92 is separated from the SAF by a layer of nonmagnetic material 94. For the experimental structure of FIG. 6, layer 88 can be the metallic element Ru. Its function is to provide strong antiferromagnetic interlayer coupling between the two ferromagnetic layers comprising the SAF.

The magnetoresistive element 80 is positioned between a bottom contact 96 and a top contact 98. The contacts provide an electrical current to the MR element. The direction of positive conventional electric current is illustrated by arrow 100 and the direction of electron current is illustrated by arrow 102. A transverse magnetic field H, as illustrated by arrow 104 is applied to the structure by a magnetic field producing means not shown in this view. Arrows 106, 108, 110 and 112 illustrate directions of magnetization in the various layers. The magnetic field 104 can generally be applied in any direction within the planes of the layers.

In one example, the device comprises the structure IrMn90/CoFe40/Ru9/CoFe40/Cu22/CoFe30, where the layers are listed from bottom to top and the numbers refer to the layer thicknesses in Å. The cross-sectional area of the example device in this example is approximately 100 nm×200 nm. Shape anisotropy defines the easy axis for the free layer, and the pinning direction is along the easy axis.

Figure 7:
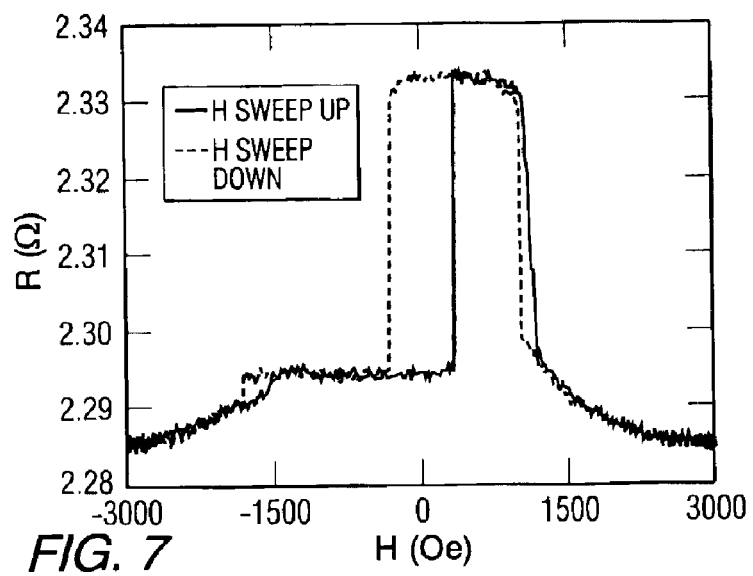
FIG. 7 is a graph of resistance versus magnetic field for the MR element of FIG. 6.
Figure 8:
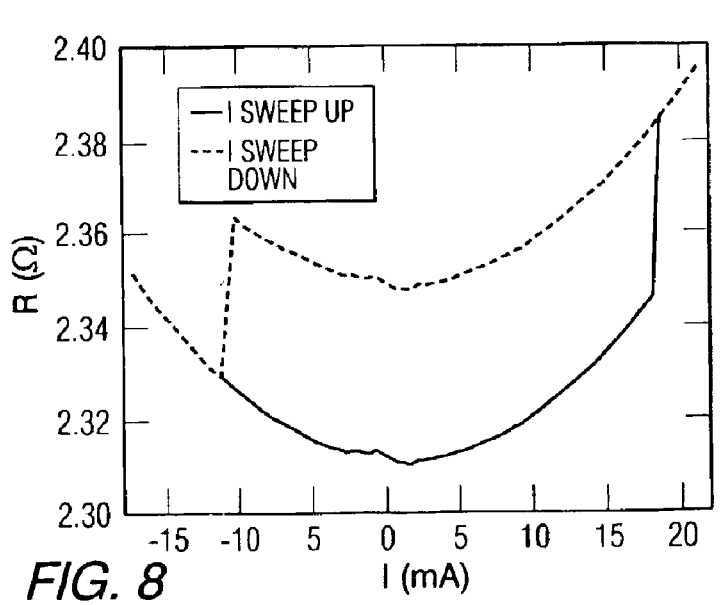
FIG. 8 is a graph of resistance versus current for the MR element of FIG. 6.

FIGS. 7 and 8 show data for the CPP structure of FIG. 6. The device of FIG. 6 is conceptually the same as the device of FIG. 3 in that the bottom CoFe layers of the trilayer structures are fixed and the top layer is free to rotate. However, in the MR of FIG. 6, the bottom layer is pinned via exchange coupling to the antiferromagnet IrMn, which keeps these layers fixed in the absence of an applied field. Another noteworthy aspect of this device is that the pinned layer 90 is actually a pinned SAF. Although the pinned layer is part of the SAF, it allows for the determination of whether or not the SAF can effectively polarize conduction electrons in order to make spin transfer efficient. The resistance versus field data in FIGS. 7 and 8 illustrate the well-separated switching thresholds of the FL and the PL around ±325 Oe and +1 kOe, respectively. The resistance versus current data in FIG. 8 again show abrupt switching between parallel and anti-parallel states with a symmetry that is consistent with that in FIG. 5. Moreover, these switching thresholds are comparable to those shown in FIG. 5 for a device of roughly the same size. So, a SAF structure can in fact be effectively used in a spin transfer based device.

To obtain the data of FIG. 7, the resistance versus field was acquired with a bias current of +3 mA. The field is parallel to the easy axis of the device. In FIG. 8, the resistance versus current was obtained in a small hard axis bias field of 250 Oe. The slow increase in resistance with increasing current is due to Joule heating while the abrupt changes in resistance correspond to magnetic realignment of the FL.

Figure 9:
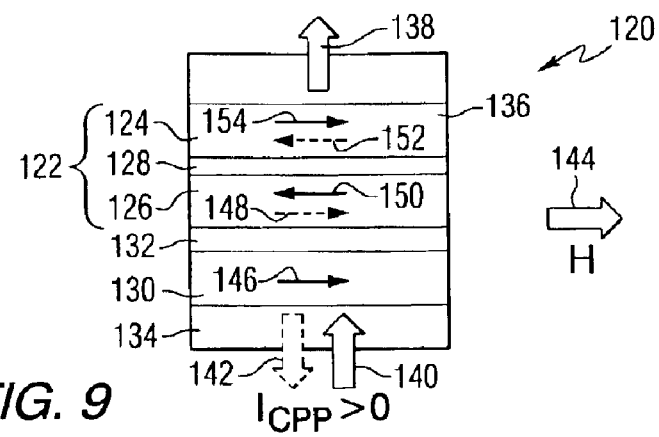
FIG. 9 is a cross-sectional view of another MR element constructed in accordance with this invention.

FIG. 9 is a cross-sectional view of a magnetoresistive element 120 in the form of a CPP pillar having three ferromagnetic layers. Magnetoresistive element 120 includes a trilayer structure 122 having two layers of ferromagnetic material 124 and 126, which can be CoFe, positioned on opposite sides of a layer of nonmagnetic material 128, which can be Ru. An additional layer of ferromagnetic material 130 is separated from the trilayer by a layer of nonmagnetic conductive material 132.

The magnetoresistive element 120 is positioned between a bottom contact 134 and a top contact 136. The contacts provide an electrical current to the MR element. The direction of conventional current is illustrated by arrows 138, 140 and 142. A transverse magnetic field H, as illustrated by arrow 144 is applied to the structure by a magnetic field producing means not shown in this view. In FIG. 9, positive current is indicated by the arrow with solid lines. The arrows 146, 148, 150, 152 and 154 in the ferromagnetic layers represent the direction of magnetization for the given field and current directions when the current amplitude is greater than the spin transfer switching thresholds. The arrows drawn as dashed lines indicate the magnetic configuration when the current direction is reversed.

Figure 10:
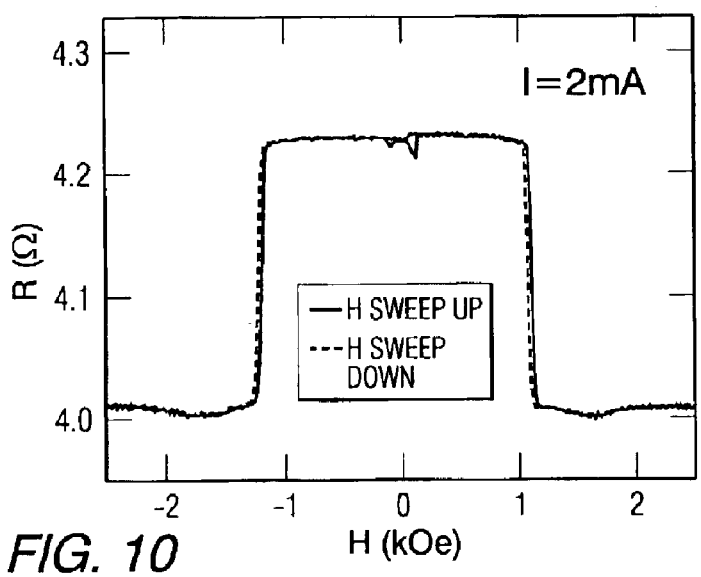
FIG. 10 is a graph of resistance versus magnetic field for the MR element of FIG. 9.
Figure 11:
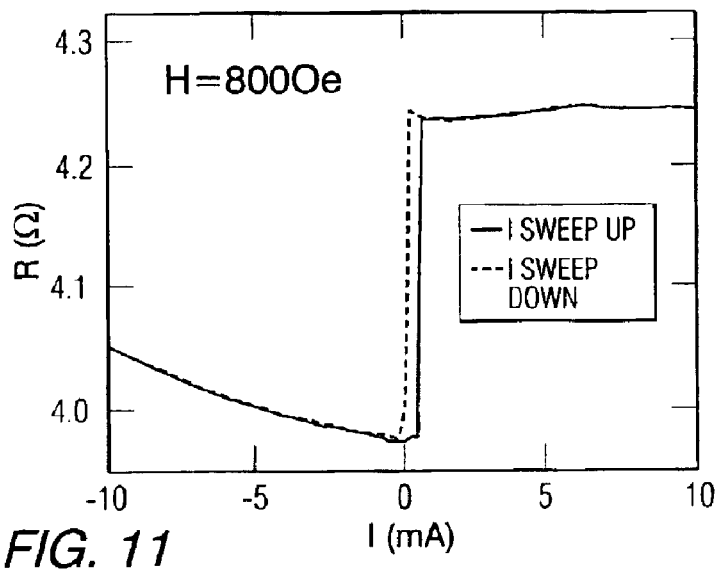
FIG. 11 is a graph of resistance versus current for the MR element of FIG. 9.

In the device of FIG. 9, the two uppermost CoFe layers are strongly coupled antiferromagnetically across a Ru spacer layer and comprise a balanced synthetic antiferromagnet (SAF). The layer structure in one example is CoFe30/Cu22/CoFe40/Ru5/CoFe40, using the notation from FIG. 3. FIG. 10 shows the resistance versus magnetic field for the structure of FIG. 9. The magnetic field is applied along the long axis, or easy axis, of the CPP pillar. The abrupt changes in resistance around 1100 Oe are consistent with the 180° realignment of the bottom two CoFe layers between parallel and antiparallel configurations. FIG. 11 shows the resistance versus current with a dc bias field applied along the easy axis. The bias field of 800 Oe is applied along the same axis used to acquire the data shown in FIG. 10.

The experimental data in FIGS. 10 and 11 build upon the data for the devices of FIGS. 3 and 6 by demonstrating the current induced switching of an unpinned SAF. The device illustrated in FIG. 9 has three nominally free, or unpinned, ferromagnetic layers. The top CoFe/Ru/CoFe layers comprise a balanced synthetic antiferromagnet that by themselves exhibit a saturation field of 3 kOe in unpatterned films and contribute negligible magnetoresistance. In a balanced synthetic antiferromagnet, the magnetic moments of the magnetic layers have equal magnitude and antiparallel directions. The magnetoresistance of this device originates largely from the CoFe/Cu/CoFe layers on the bottom, which are only weakly coupled through mostly magnetostatic interaction. The resistance versus field data in FIG. 10 exhibit abrupt switching between low and high resistance states around ±1 kOe. The measured $\Delta R/R$ and $\Delta R \cdot A$ from this device indicate that these changes in resistance are consistent with 180° realignment between the bottom two CoFe layers. In addition, data from devices with a variety of different cross sections indicate that this device has shape anisotropy. Although the data lack information about the relative alignment of the top CoFe layer in the SAF, modeling indicates the two layers are in an antiparallel aligned state both before and after the switching event. The resistance versus current data in FIG. 11 exhibit remarkably efficient switching between the same low and high resistance states in FIG. 10. The symmetry of the current-induced switching is the same as that in FIGS. 5 and 8, implying that the bottom CoFe layer is fixed in the direction of the magnetic field and that the top SAF is switching by 180° as a tightly coupled unit. Since the moments, $M_s t$, of the top two CoFe layers are the same, the SAF as a whole has no net moment and is only restricted by shape anisotropy to have the magnetizations lie along the easy, or long, axis of the CPP pillar. Hence, the SAF can easily switch its orientation by 180° with little cost in energy, which is also the likely reason why the current induced switching is so efficient.

The experimental data can be summarized as follows. A SAF can sufficiently polarize a CPP current so that spin transfer can efficiently switch a ferromagnetic layer by 180°. This SAF structure can have balanced moments for the two antiparallel layers, and it can be used for the FL, PL, or both. Finally, the existing evidence suggests that spin transfer, like giant magnetoresistance (GMR), is negligible across the Ru interlayer in the SAF.

Figure 12:
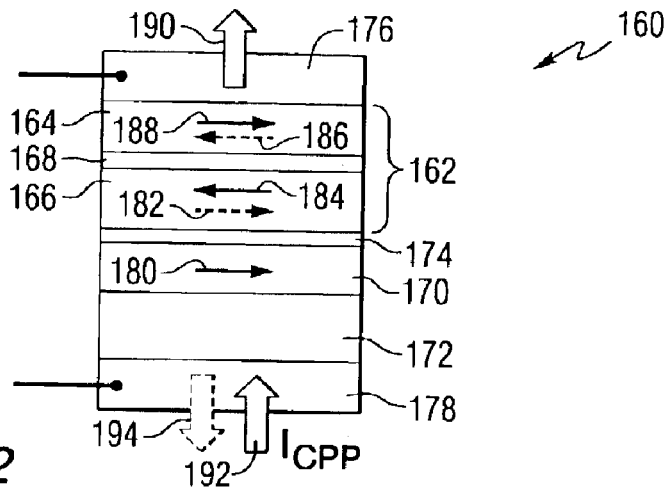
FIGS. 12, 13 and 14 are cross-sectional views of alternative MR elements constructed in accordance with this invention.
Figure 13:
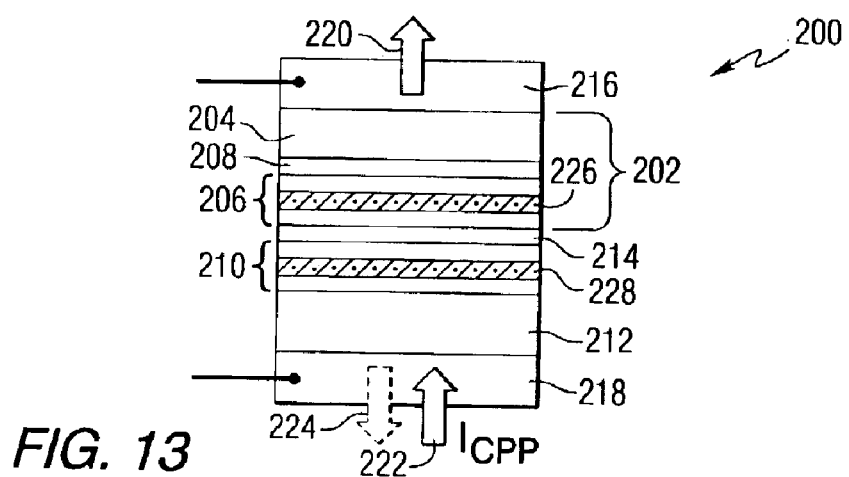
Figure 14:
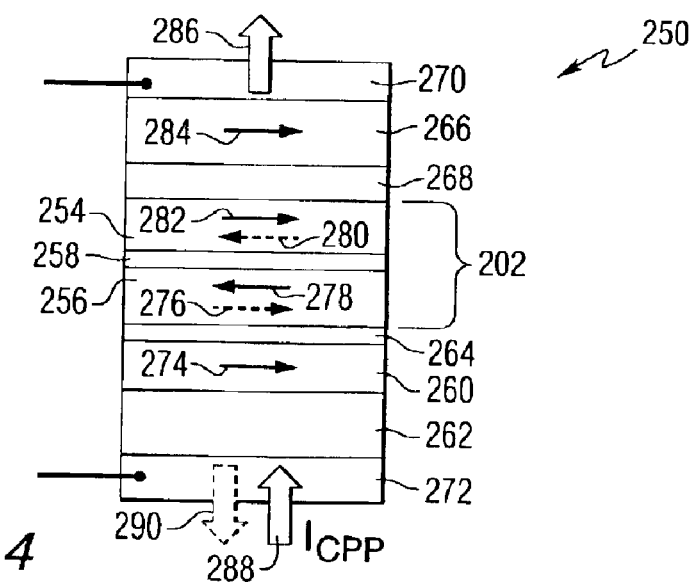

FIGS. 12, 13 and 14 are cross-sectional views of different MRAM magnetoresistive elements constructed in accordance with this invention. The arrows in the ferromagnetic layers indicate the direction of magnetization for the indicated current above the spin transfer switching threshold. FIG. 12 shows a magnetoresistive element 160 that includes a synthetic antiferromagnetic layer 162 having first and second ferromagnetic layers 164 and 166 on opposite sides of a nonmagnetic layer 168. A pinned layer 170 is positioned adjacent to an antiferromagnetic layer 172 and separated from the synthetic antiferromagnetic layer by a nonmagnetic layer 174. Means for supplying an electric current to the magnetoresistive element is provided in the form of an upper electrical lead 176 and a lower electrical lead 178. Arrows 180, 182, 184, 186 and 188 show the direction of magnetization of the various layers. Arrows 190 and 192 show the direction of positive electrical current, and arrow 194 shows the direction of negative electric current. The structure of FIG. 12 shows the incorporation of a SAF free layer in a CPP spin valve.

FIG. 13 shows a magnetoresistive element 200 that includes a synthetic antiferromagnetic layer 202 having first and second ferromagnetic layers 204 and 206 on opposite sides of a nonmagnetic layer 208. A pinned layer 210 is positioned adjacent to an antiferromagnetic layer 212 and separated from the synthetic antiferromagnetic layer by a nonmagnetic layer 214. Means for supplying an electric current to the magnetoresistive element is provided in the form of an upper electrical lead 216 and a lower electrical lead 218. Arrows showing the direction of magnetization of the various layers have been omitted from FIG. 13. Arrows 220 and 222 show the direction of positive electrical current, and arrow 224 shows the direction of negative electric current. The structure of FIG. 13 shows the addition of nano-oxide layers 226 and 228 in layers 206 and 210 respectively. The nano-oxide layers can be inserted into the pinned layer, the free layer, or both in order to boost the amplitude of the resistance of the device.

FIG. 14 shows a magnetoresistive element 250 that includes a synthetic antiferromagnetic layer 252 having first and second ferromagnetic layers 254 and 256 on opposite sides of a nonmagnetic layer 258. A pinned layer 260 is positioned adjacent to an antiferromagnetic layer 262 and separated from the synthetic antiferromagnetic layer by a nonmagnetic layer 264. A pinned reference layer 266 is separated from the synthetic antiferromagnetic layer by a nonmagnetic layer 268. Means for supplying an electric current to the magnetoresistive element is provided in the form of an upper electrical lead 270 and a lower electrical lead 272. Arrows 274, 276, 278, 280, 282 and 284 show the direction of magnetization of the various layers. Arrows 286 and 288 show the direction of positive electrical current, and arrow 290 shows the direction of negative electric current. The structure of FIG. 14 shows the incorporation of the SAF free layer in a structure that includes an insulating tunnel barrier 264 and a Cu spacer layer 268. The magnetoresistance is dominated by the tunnel barrier and is therefore used for the read-back signal. The Cu spacer layer mediates spin transfer between the top ferromagnetic layer in the free layer and a pinned reference layer.

Experimental data show that it is unnecessary to constrain the FL to only a single ferromagnetic layer. Spin transfer enables the possibility for designs that provide flux closure. FIGS. 12, 13 and 14 show three examples of magnetoresistive elements that incorporate a balanced SAF as the FL. The simplest design is that in FIG. 12 in which a CPP GMR bottom spin valve structure has a SAF FL. If the amplitude of the MR signal from the CPP spin valve is too low, then a nano-oxide layer (NOL) can be inserted into the FL, the PL, or both in order to boost the resistance and MR. An example of the application of NOL's is shown in FIG. 13. Another alternative to boost the read-back amplitude is shown in FIG. 14. This structure decouples the writing and read-back functions of the MR element in that different parts of the thin film stack are roughly independent of each other and optimized for either writing or read-back. An insulating tunnel barrier produces the predominant voltage drop and the magnetoresistance across the tunnel junction is used to measure the state of the FL. Spin momentum transfer is mediated by the upper three layers comprised of a pinned reference layer, a Cu spacer, and the top ferromagnetic layer in the FL SAF. The specific examples illustrated in FIGS. 12, 13 and 14 can be further generalized.

There are many choices of materials and their thicknesses. Typical antiferromagnetic materials include IrMn, PtMn, PtPdMn, and NiMn. Some permanent magnet materials that can be used include CoPt, CoCrPt, FePt, or FePtCu. Ferromagnetic materials include Co, Ni, Fe, and alloys of these three in combination with each other and possibly with other elements. The non-magnetic metallic spacers should efficiently transport spin polarized electrons from one ferromagnetic layer to another, examples of which are Cu, Ag, Au, or any other low resistance metal. Thicknesses of the layers would typically be in the range of 0.5 to 20 nm.

While the PL in the disclosed examples are shown as a single layer of soft ferromagnetic material exchange biased by an antiferromagnet, other pinned layer structures can certainly be applied. Possible alternatives include a SAF pinned by an antiferromagnet or permanent magnet, a single permanent magnet layer, or a soft ferromagnet exchange coupled to a permanent magnet. These different options are also available for the pinned reference layer of FIG. 14.

The thicknesses of the layers within the SAF can be varied as long as the SAF still functions as intended. The thickness of the non-magnetic spacer should provide strong Ruderman-Kittel-Kasuya-Yosida (RKKY) interlayer coupling that favors antiparallel alignment. The strength of the interaction is material specific, and Ru produces among the highest reported coupling strengths. The ferromagnetic layers need to comply with the target anisotropy so that the MRAM will have stable bits, and their thicknesses should be chosen to satisfy that constraint. Furthermore, it is preferable that the ferromagnets have thick enough layers that sufficiently polarize the conduction electrons.

A balanced SAF has equal moments for the upper and lower ferromagnetic layers. This can be expressed as $(M_s t)_u = (M_s t)_l$, where $M_s$ is the saturation magnetization, t is the thickness, and the subscript indicates whether the parameter corresponds to the upper (u) or lower (l) layers. So, in general, the SAF can be fabricated from more than one type of ferromagnetic material.

The maximum resistance area product (R·A) for the insulating tunnel barrier is constrained by the irreversible breakdown voltage for the barrier and the need to produce large current densities that are required to produce a significant spin transfer torque. Typical breakdown voltages, $V_b$, for tunnel junctions are on the order of ~1 V or less. Spin transfer is observable for current densities (J) on the order of ~$10^7$–$10^8$ A/cm$^2$. Using Ohm's Law [V=IR=(JA)((R·A)/A))], this implies that R·A~10 $\Omega$-$\mu$m$^2$ or less.

The disclosed examples show SAF FL's having only two ferromagnetic layers. However, this concept can be extended to FL's having more than two ferromagnetic layers as long as the net FL moment is zero. In addition, the ordering of the layers from bottom to top can, in principle, be reversed.

The stabilization of the bits can be done in the usual manner through the use of shape anisotropy, where the CPP pillar has an elongated cross-section having, for example, a rectangular or elliptical shape. Finally, the disclosed examples have omitted details about the overall MRAM architecture and the additional electronics that would be used in combination with each cell to control writing to, and reading from, the magnetoresistive elements. The designs proposed in FIGS. 12, 13 and 14 are intended to be flexible enough so that they can be incorporated into most MRAM systems.

Figure 15:
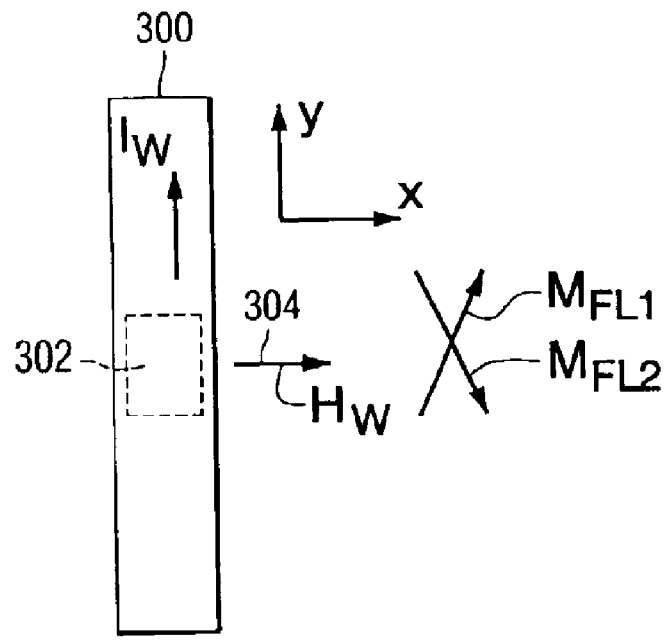
FIG. 15 is a top view of another MR element constructed in accordance with this invention.
Figure 16:
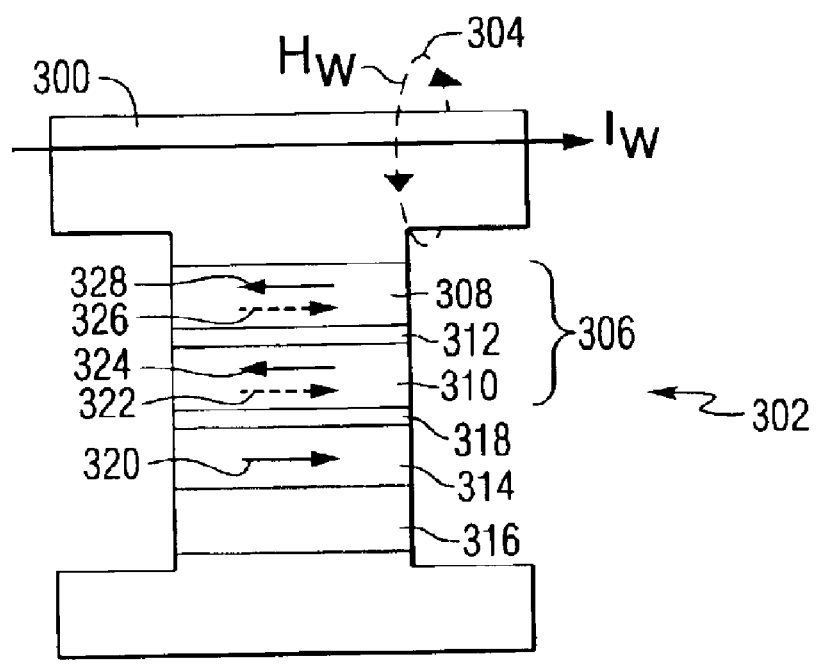
FIG. 16 is a cross-sectional view of the MR element of FIG. 15.

One additional example of the invention is shown in FIG. 15. FIG. 16 is a cross-sectional view of the magnetoresistive element and word line of FIG. 15. FIG. 15 shows the addition of a current carrying wire 300 that is positioned adjacent to a magnetoresistive element 302 and applies a magnetic field 304 along the hard axis of the CPP pillar during the write process. FIG. 15 is a top schematic view showing the current carrying wire 300, or word line, that overlaps a magnetoresistive element.

FIG. 16 shows an MR element 302 including a SAF layer 306, which includes ferromagnetic layers 308 and 310 separated by a nonmagnetic layer 312. A pinned layer 314 is positioned adjacent to an antiferromagnetic layer 316 and separated from the SAF layer by a conductive nonmagnetic layer 318. Arrows 320, 322, 324, 326 and 328 show directions of magnetization of the various layers of the pillar. The magnetic field produced by the word line, $H_w$, causes the two magnetic layers comprising the balanced SAF to scissor as shown by arrows in FIG. 15 labeled $M_{FL1}$ and $M_{FL2}$. The magnetoresistive element 302 has a structure similar to that of FIG. 12. Note that associated diodes and transistors that would be used to connect a current source to the MR element have been omitted from FIGS. 15 and 16 for clarity.

The example of FIGS. 15 and 16 still employs a balanced SAF and spin transfer for the write mechanism. However, an additional current carrying wire produces a magnetic field along the hard axis of the MR element that assists the switching of the FL when writing a bit. The field amplitude from the word line is envisioned to be comparable to the fields from conventional MRAM that writes bits with magnetic fields. This field is insufficient to saturate the two ferromagnetic layers in the SAF along the field direction, but it produces a state where the magnetizations are canted away from their quiescent state direction. The hard axis field induces a finite angle of deflection between the magnetizations of the PL and SAF. Since spin transfer torque is proportional to $\overline{m}_{FL} \times \overline{m}_{FL} \times \overline{m}_{PL}$, a finite angle of deflection at the start of the write process will to a greater initial torque and potentially faster switching speeds.

Figure 17:
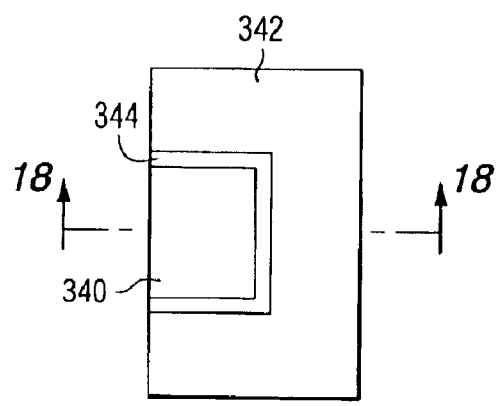
FIG. 17 is a top view of another MR element constructed in accordance with this invention.
Figure 18:
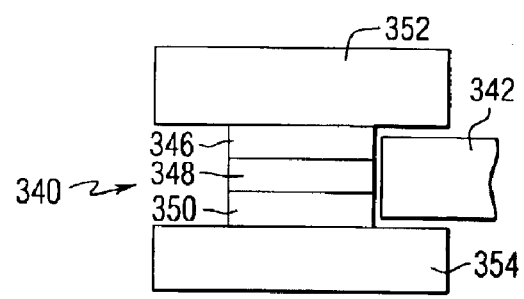
FIG. 18 is a cross-sectional view of the MR element of FIG. 17.

Another example of the invention is shown in FIGS. 17 and 18. FIG. 17 is a schematic representation of a magnetoresistive element 340 with soft ferromagnetic material 342 that is built adjacent to the CPP pillar in order to provide a flux closure path for the free layer. The CPP pillar has soft magnetic material wrapped closely along three of its sides. A nonmagnetic insulator 344 is positioned between the soft ferromagnetic material 342 and the magnetoresistive element 340. The flux conductor can, in principle, surround the CPP pillar on all four sides if necessary. FIG. 18 is a cross-sectional view of the element of FIG. 17, taken along line 18—18. In FIG. 18, the MR element is shown to include layers 346, 348 and 350 positioned between conductors 352 and 354. The insulation 344 of FIG. 17 has been omitted in FIG. 18.

The MR element of FIGS. 17 and 18 has a FL made up of only a single ferromagnetic layer (that is, it is not a SAF layer) and flux closure is provided by a relatively large volume of soft ferromagnetic material surrounding the CPP pillar. The flux conductor is designed to act like a sink of magnetic flux that provides flux closure for the FL and shields neighboring cells from stray magnetic fields. Such a design would be impractical for MRAM designs that are based on a magnetic field based write mechanism since most of the flux density produced by the current carrying wires would pass through the flux conductor rather than the FL. Hence, only very large magnetic fields would be able to switch the FL magnetization, leading to a very inefficient design. However, spin transfer enables this concept. The flux conductor can be placed anywhere close to the stack. FIG. 17 shows one possibility where the flux conductor is wrapped around the side of the CPP pillar.

Figure 19:
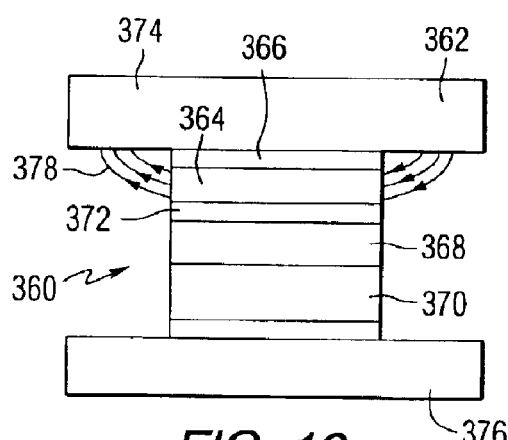
FIG. 19 is a cross-sectional view of another MR element constructed in accordance with this invention.
Figure 20:
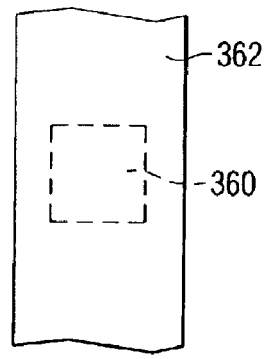
FIG. 20 is a top view of the MR element of FIG. 19.

Another option is to place soft magnetic material on top of the MR element, as shown in FIGS. 19 and 20. FIG. 19 shows a cross-sectional view of a CPP magnetoresistive element 360 pillar. The MR element has soft magnetic material keeper 362 located above the free layer 364 and separated from the free layer by a nonmagnetic conducting layer 366. The magnetoresistive element 360 also includes a pinned layer 368 adjacent to a surface of an antiferromagnetic layer 370 and separated from the free layer by an insulating tunnel barrier 372. In this example, the magnetic material keeper 362 is conducting and also forms part of the electrical lead 374. A second electrical lead 376 is located at the opposite end of the MR element. Flux lines 378 show the flux closure between the free layer and soft magnetic material 362. FIG. 20 is a top view of the structure of FIG. 19.

Since spin transfer can switch a FL using electrical current alone, this raises the possibility that a spin transfer design can incorporate complete flux closure for the FL. This invention shows that a SAF can sufficiently polarize the conduction electrons in order to produce a finite spin transfer torque.

This invention provides an MRAM having flux closure for the FL. The mechanism of spin momentum transfer enables better flux closure than can be achieved with designs that write bits using magnetic fields. The disclosed examples and experimental data show how a balanced SAF can be used for either the PL or FL in an MR element for an MRAM based on spin transfer. The MRAM of this invention can achieve improved flux closure that will lead to more reliable formation of single domain bits for every one of the billions of cells in an MRAM.

The disclosed experimental data show that spin transfer can indeed switch a balanced SAF structure by 180° with respect to a fixed magnetic layer. These data show the feasibility of MRAM designs that provide complete flux closure for the FL and write bits via spin momentum transfer. These designs provide a solution for ultra-high density MRAM with uniformly magnetized, single domain bits that can be incorporated into a very dense and closely packed array of cells.

In another aspect, the invention also encompasses a method of storing data in an MRAM constructed in accordance with this invention. The method comprises: providing a plurality of memory elements each comprising a magnetic pinned layer, a synthetic antiferromagnetic free layer, and a first nonmagnetic layer positioned between the magnetic pinned layer and the synthetic antiferromagnetic free layer, wherein the synthetic antiferromagnetic free layer includes a first ferromagnetic layer, a second ferromagnetic layer, and a first nonmagnetic layer positioned between the first ferromagnetic layer and the second ferromagnetic layer, wherein the directions of magnetization of the first ferromagnetic layer and the second ferromagnetic layer are antiparallel; and applying a current to the plurality of memory elements to affect the direction of magnetization of the synthetic antiferromagnetic free layer.

While the invention has been described in term of several examples, it will be apparent to those skilled in the art that various changes can be made to the disclosed examples without departing from the scope of the invention as defined by the following claims.

What is claimed is:

1. A magnetic random access memory comprising:
   a plurality of memory elements each comprising a magnetic pinned layer; a synthetic antiferromagnetic free layer including a first ferromagnetic layer, a second ferromagnetic layer, and a first nonmagnetic layer positioned between the first ferromagnetic layer and the second ferromagnetic layer, wherein the directions of magnetization of the first ferromagnetic layer and the second ferromagnetic layer are antiparallel; and a first conductive nonmagnetic layer positioned between the magnetic pinned layer and the synthetic antiferromagnetic free layer; and
   means for applying a current to each of the plurality of memory elements to affect the direction of magnetization of the synthetic antiferromagnetic free layer.

2. The magnetic random access memory of claim 1, wherein the magnetic moment of the first ferromagnetic layer and the magnetic moment of the second ferromagnetic layer are balanced.

3. The magnetic random access memory of claim 1, further comprising:
   an antiferromagnetic layer positioned adjacent to the magnetic pinned layer.

4. The magnetic random access memory of claim 1, further comprising:
   a nano-oxide layer positioned either within the first ferromagnetic layer, or within the pinned layer, or within both the first ferromagnetic layer and the pinned layer.

5. The magnetic random access memory of claim 1, further comprising:
   a second pinned layer;
   a second nonmagnetic layer positioned between the second pinned layer and the synthetic antiferromagnetic free layer; and
   wherein the first nonmagnetic layer comprises an insulating tunnel barrier layer.

6. The magnetic random access memory of claim 1, further comprising:
   means for applying a magnetic field in a direction substantially perpendicular to the directions of magnetization of the synthetic antiferromagnetic free layer.

7. The magnetic random access memory of claim 6, wherein the means for applying a magnetic field in a direction substantially perpendicular to the directions of magnetization of the synthetic antiferromagnetic free layer comprises:
   a current carrying wire positioned adjacent to the synthetic antiferromagnetic free layer.

8. The magnetic random access memory of claim 1, wherein the pinned layer comprises one of: a single layer of soft ferromagnetic material exchange biased by an antiferromagnet; a synthetic antiferromagnet pinned by exchange coupling to an antiferromagnet or permanent magnet; a single permanent magnet layer; or a soft ferromagnet exchange coupled to a permanent magnet.

9. A method of storing information in a magnetic random access memory comprising:
   providing a plurality of memory elements each comprising a magnetic pinned layer, a synthetic antiferromagnetic free layer, and a first nonmagnetic layer positioned between the magnetic pinned layer and the synthetic antiferromagnetic free layer, wherein the synthetic antiferromagnetic free layer includes a first ferromagnetic layer, a second ferromagnetic layer, and a first nonmagnetic layer positioned between the first ferromagnetic layer and the second ferromagnetic layer, wherein the directions of magnetization of the first ferromagnetic layer and the second ferromagnetic layer are antiparallel; and
   applying a current to the plurality of memory elements to affect the direction of magnetization of the synthetic antiferromagnetic free layer.

10. The method of claim 9, wherein the magnetic moment of the first ferromagnetic layer and the magnetic moment of the second ferromagnetic layer are balanced.

11. The method of claim 9, wherein each of the plurality of memory elements further comprises:
    an antiferromagnetic layer positioned adjacent to the magnetic pinned layer.

12. The method of claim 9, wherein each of the plurality of memory elements further comprises:
    a nano-oxide layer positioned either within the first ferromagnetic layer, or within the pinned layer, or within both the first ferromagnetic layer and the pinned layer.

13. The method of claim 9, wherein each of the plurality of memory elements further comprises:
    a second pinned layer;
    a second nonmagnetic layer positioned between the second pinned layer and the synthetic antiferromagnetic free layer; and
    wherein the first nonmagnetic layer comprises an insulating tunnel barrier layer.

14. The method of claim 9, wherein each of the plurality of memory elements further comprises:
    means for applying a magnetic field in a direction substantially perpendicular to the directions of magnetization of the synthetic antiferromagnetic free layer.

15. The method of claim 14, wherein the means for applying a magnetic field in a direction substantially perpendicular to the directions of magnetization of the synthetic antiferromagnetic free layer comprises:
    a current carrying wire positioned adjacent to the synthetic antiferromagnetic free layer.

16. The method of claim 9, wherein the pinned layer comprises one of: a single layer of soft ferromagnetic material exchange biased by an antiferromagnet; a synthetic antiferromagnet pinned by exchange coupling to an antiferromagnet or permanent magnet; a single permanent magnet layer, or a soft ferromagnet exchange coupled to a permanent magnet.

17. A magnetic random access memory comprising:

a plurality of memory elements each comprising a magnetic pinned layer, a free layer, and a first conductive nonmagnetic layer positioned between the magnetic pinned layer and the free layer;

means for applying a current to each of the plurality of memory elements to affect the direction of magnetization of the synthetic antiferromagnetic free layer; and a magnetic structure positioned adjacent to opposite ends of the free layers for providing a flux closure path.

18. The magnetic random access memory of claim 17, wherein the magnetic structure comprises:

a magnetic keeper positioned adjacent to a side of each of the plurality of memory elements.

19. The magnetic random access memory of claim 17, wherein the magnetic structure comprises:

a magnetic keeper positioned adjacent to the free layer of each of the plurality of memory elements.

20. The magnetic random access memory of claim 17, wherein the pinned layer comprises one of: a single layer of soft ferromagnetic material exchange biased by an antiferromagnet; a synthetic antiferromagnet pinned by exchange coupling to an antiferromagnet or permanent magnet; a single permanent magnet layer, or a soft ferromagnet exchange coupled to a permanent magnet.

21. A magnetic random access memory comprising:

a plurality of memory elements each comprising a magnetic pinned layer, a synthetic antiferromagnetic free layer including a first ferromagnetic layer, a second ferromagnetic layer, and a first nonmagnetic layer positioned between the first ferromagnetic layer and the second ferromagnetic layer, wherein the directions of magnetization of the first ferromagnetic layer and the second ferromagnetic layer are antiparallel; and a first conductive nonmagnetic layer positioned between the magnetic pinned layer and the synthetic antiferromagnetic free layer; and a current carrying wire for applying a current to each of the plurality of memory elements to affect the direction of magnetization of the synthetic antiferromagnetic free layer.

22. A magnetic random access memory comprising:

a plurality of memory elements each comprising a magnetic pinned layer, a free layer, and a first conductive nonmagnetic layer positioned between the magnetic pinned layer and the free layer, a current carrying wire for applying a current to each of the plurality of memory elements to affect the direction of magnetization of the synthetic antiferromagnetic free layer; and a magnetic structure positioned adjacent to opposite ends of the free layers for providing a flux closure path.

* * * * *

UNITED STATES PATENT AND TRADEMARK OFFICE
CERTIFICATE OF CORRECTION

PATENT NO. : 6,865,109 B2 Page 1 of 1
DATED : March 8, 2005
INVENTOR(S) : Mark William Covington It is certified that error appears in the above-identified patent and that said Letters Patent is hereby corrected as shown below:

<u>Column 9,</u>
Line 63, after "will" add -- lead --.

Signed and Sealed this

Thirtieth Day of May, 2006

JON W. DUDAS
*Director of the United States Patent and Trademark Office*